United States Patent
Manger et al.

(10) Patent No.: US 7,473,952 B2
(45) Date of Patent: Jan. 6, 2009

(54) MEMORY CELL ARRAY AND METHOD OF MANUFACTURING THE SAME

(75) Inventors: Dirk Manger, Dresden (DE); Stefan Slesazeck, Dresden (DE); Stefan Tegen, Dresden (DE); Klaus Muemmler, Dresden (DE); Alexander Sieck, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 24 days.

(21) Appl. No.: 11/118,768

(22) Filed: May 2, 2005

(65) Prior Publication Data

US 2006/0244024 A1 Nov. 2, 2006

(51) Int. Cl.
*H01L 27/108* (2006.01)
*H01L 29/94* (2006.01)

(52) U.S. Cl. .................. 257/296; 257/306; 257/307; 257/308; 257/E27.084; 257/E27.085; 257/E27.086

(58) Field of Classification Search .................. None
See application file for complete search history.

(56) References Cited

U.S. PATENT DOCUMENTS

| | | | | |
|---|---|---|---|---|
| 5,502,320 | A * | 3/1996 | Yamada | 257/302 |
| 5,945,707 | A | 8/1999 | Bronner et al. | |
| 6,440,801 | B1 * | 8/2002 | Furukawa et al. | 438/272 |
| 6,906,371 | B2 * | 6/2005 | Ma et al. | 257/296 |
| 6,956,260 | B2 * | 10/2005 | Manger et al. | 257/302 |
| 7,120,046 | B1 * | 10/2006 | Forbes | 365/149 |
| 2001/0025973 | A1 * | 10/2001 | Yamada et al. | 257/296 |
| 2002/0028541 | A1 * | 3/2002 | Lee et al. | 438/149 |
| 2004/0026763 | A1 * | 2/2004 | Ma et al. | 257/590 |
| 2005/0190617 | A1 * | 9/2005 | Forbes et al. | 365/200 |
| 2006/0071259 | A1 * | 4/2006 | Verhoeven | 257/299 |

FOREIGN PATENT DOCUMENTS

DE 10361695 B3 2/2005

* cited by examiner

*Primary Examiner*—Andy Huynh
*Assistant Examiner*—Hoang-Quan Ho
(74) *Attorney, Agent, or Firm*—Edell, Shapiro & Finnan, LLC

(57) ABSTRACT

A memory cell array includes a plurality of active areas in which a plurality of memory cells are formed. A memory cell includes a storage capacitor, a transistor at least partially formed in a semiconductor substrate with a substrate surface, the transistor including a first source/drain region. A second source/drain region being formed adjacent to the substrate surface, a channel region connecting the first and second source/drain regions. The first source/drain region is formed adjacent to the substrate surface. The channel region is disposed in the semiconductor substrate, and a gate electrode. Rows of the active areas are separated from each other by isolation grooves that extend along a first direction. A first and a second word lines are disposed on either lateral sides of each of the rows of active areas. The first and the second word lines are connected with each other via the gate electrodes of the transistors of the corresponding row of active areas.

23 Claims, 18 Drawing Sheets

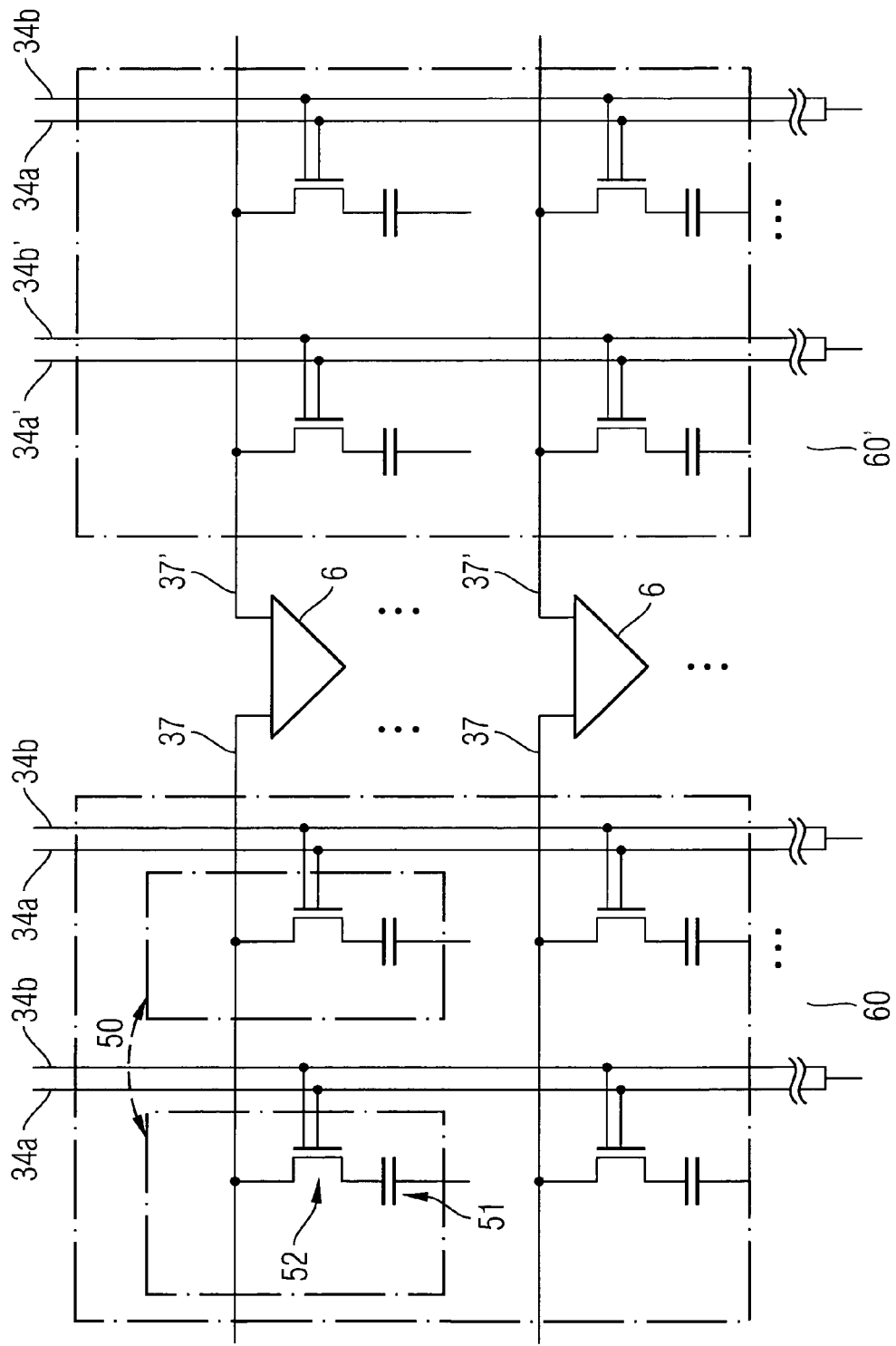

MEMORY CELL ARRAY AND METHOD OF MANUFACTURING THE SAME

FIELD OF THE INVENTION

The present invention relates to a memory cell array and to a method of manufacturing a memory cell array.

BACKGROUND

Memory cells of a dynamic random access memory (DRAM) generally comprise a storage capacitor for storing an electrical charge which represents an information to be stored, and an access transistor connected with the storage capacitor. The access transistor comprises a first and a second source/drain regions, a channel connecting the first and second source/drain regions and a gate electrode controlling an electrical current flowing between the first and second source/drain regions. The transistor is usually at least partially formed in a semiconductor substrate. The information stored in the storage capacitor is read out or written in by addressing the access transistor via the corresponding word line. In particular, the information is read out to a corresponding bit line via a bit line contact.

There is a lower boundary of the channel length of the access transistor, below which the isolation properties of the access transistor in a non-addressed state are not sufficient. The lower boundary of the effective channel length $L_{eff}$ limits the scalability of planar transistor cells with an access transistor, formed horizontally with respect to the substrate surface of the semiconductor substrate.

Vertical transistor cells offer a possibility of enhancing the channel length while maintaining the surface area necessary for forming the memory cell. In such a vertical transistor cell the source/drain regions of the access transistor and the channel region are arranged in a direction perpendicular to the substrate surface. One of the problems involved with such a vertical transistor cell is the difficulty in providing a surface contact to a stacked capacitor. Accordingly, such a vertical transistor is difficult to integrate with a stacked capacitor.

Enhancing the effective channel length $L_{eff}$ by a recessed channel transistor is known. In such a transistor, the first and second source/drain regions are arranged in a horizontal plane parallel to the substrate surface. The gate electrode is arranged in a recess groove, which is disposed between the two source/drain regions of the transistor in the semiconductor substrate. Accordingly, the effective channel length equals to the sum of the distance between the two source/drain regions and the two fold of the depth of the recess groove. The effective channel width $W_{eff}$ corresponds to the nominal structural size F.

It is also known that a memory cell array has transistors formed in continuous active area lines. The active area lines are arranged in parallel with the bit lines. In particular, the gate electrodes of the transistors from part from the word lines and the word lines including the gate electrodes are implemented as buried word lines.

Further, it is know that a transistor is formed in an active area with the form of a ridge, where two gate electrodes each form part of a corresponding word lines and disposed along the lateral sides of the active area. The active area is recessed at a channel portion of the transistor.

An improved memory cell array and method of forming such a memory cell array are desirable.

SUMMARY

The present invention provides a memory cell array including a plurality of memory cells and a plurality of active areas formed in a semiconductor substrate with a substrate surface. Each active area has two lateral sides that extend along a first direction. Rows of active areas are separated from each other by isolation grooves that extend n the first direction. Each memory cell includes a storage capacitor, and a transistor at least partially formed in one of the active areas. The transistor includes a first source/drain region connected with an electrode of the storage capacitor, a second source/drain region formed adjacent to the substrate surface, a channel region connecting first and second source/drain regions, and a gate electrode disposed along the channel region and electrically isolated from the channel region by a gate isolating layer. The first source/drain region is formed adjacent to the substrate surface. The channel region is disposed in the active area. The channel region extends in the first direction. The gate electrode controls an electrical current flowing between the first and second source/drain regions. A first and second word lines are disposed on either lateral sides of each of the rows of active areas. The first and second word lines are connected with each other via the gate electrodes of the transistors of the corresponding row of active areas.

In particular, according to the present invention, the word lines with the gate electrodes form a kind of a ladder structure according to which two word lines of the memory cell array are arranged in parallel with the channel. The channel is crossed by a gate electrode, which connects the two word lines. Accordingly, the word lines can be formed without employing special lithographic steps.

In particular, according to a preferred embodiment, two word lines can be disposed in each of the isolation grooves. The two word lines are isolated from each other and assigned to two different rows of active areas. In this case, the word lines can easily be formed by a spacer process without the necessity of performing lithographic steps. In addition, the exact positioning of the word lines is ensured since the step of forming the word lines is performed self-aligned with respect to the isolation grooves and, consequently, the active areas.

According to a preferred embodiment, each gate electrode has a top side. The top side of the gate electrode is disposed beneath the surface of the semiconductor substrate. As a consequence, the channel connecting the first and second source/drain regions is a curved or recessed channel. In particular, the active area has the shape of a "U", wherein the first and second source/drain regions are disposed in the vertical portions of the active area. In addition, the ladder structure of the word lines including the gate electrodes is supported by the vertical portion of the active areas in which the first and second source/drain regions are formed. Thereby, the word lines with the gate electrodes are formed in a self-aligned manner with respect to the first and second source/drain regions.

If the active area has the shape of a "U" and the channel is a curved or recessed channel, a distance between the doped source/drain regions can be enlarged without increasing the area of the transistor. Due to the enlarged distance, an electrical field at the source/drain region channel junction and, a leakage current are decreased.

Nevertheless, the special structure of two adjacent word lines and the corresponding gate electrodes, by which structure a ladder is formed, can be implemented with any arbitrary shape of the active area.

Preferably, the channel region includes a fin-region in which the channel has the shape of a ridge. The ridge includes a top side and two lateral sides in a cross section perpendicular to a line connecting the first and second source/drain regions. The gate electrode is disposed at three sides of the ridge.

In this case, the effective width of the channel is enlarged, which improves the characteristics of the transistor. In particular, the transistor of the memory cell array of the present invention provides an improved on-current compared to known transistors, since the width of the channel is increased and the resistance is reduced. Nevertheless, due to the narrow width of the fin region, the transistor body can be depleted, so that the off-current of the transistor improved.

Nevertheless, the special structure of two adjacent word lines and the corresponding gate electrodes, by which structure a ladder is formed, can be implemented with any arbitrary shape of the channel region.

In particular, the storage capacitor can be implemented as a stacked capacitor.

According to the invention, preferably, the plurality of memory cells are arranged in rows and columns, respectively. The two adjacent rows of memory cells are separated by two word lines that are electrically isolated from each other, wherein the memory cells are arranged in the form of a regular grid.

In particular, the memory cells of adjacent rows are disposed in the same columns, respectively. In addition, the memory cells of adjacent columns are disposed in the same rows, respectively.

According to the invention, the gate electrode has a bottom side. The first and second source/drain regions extend to a depth below or equal to the bottom side of the gate electrode.

Preferably, the bit lines are formed on the substrate surface. In particular, the bit lines are directly adjacent to the substrate surface so that the bit lines are connected with the second source/drain regions without the necessity of a bit line contact.

An isolating spacer is disposed between the first source/drain region and the gate electrode and between the second source/drain region and the gate electrode. The isolating spacer has a larger thickness than the gate isolating layer. In this case, the influence of the potential of the gate electrode on the first and second source/drain regions can be lowered. In particular, by effectively shielding the gate potential from the first source/drain region which is connected with an electrode of a storage capacitor, the retention time of the memory cell, i.e., the time during which, an information can be recognizably stored in the memory cell, can be improved. At the same time, since the thickness of the gate isolating layer is smaller than the thickness the isolating spacer, the conductivity of the channel is effectively controlled.

In particular, if the spacer is made of silicon dioxide, the influence of the gate electrode on the first and second source/drain regions can further be lowered.

The present invention further provides a method of manufacturing a memory cell array including providing a semiconductor substrate with a substrate surface, forming first and second openings in the substrate surface, defining isolation trenches in the semiconductor substrate, filling the isolation trenches with an isolating material, providing a agate isolating layer on a bottom side of the second openings, providing a conductive material in the second openings and on the side walls of the isolation trenches, providing an isolating material on the top side of the gate electrodes and between the word lines of one isolation trench, providing first and second source/drain regions in the substrate material between the first and second openings in an active area, forming a plurality of bit line contacts and bit lines, and forming a plurality storage capacitors. The first openings having a larger depth than the second openings, the depth being measured from the substrate surface, two first openings being followed by one second opening, and one second opening being followed by two first openings. Active areas are formed between two adjacent isolation trenches. Gate electrodes are formed of the conductive material in the second openings and word lines are formed of the conductive material on the side walls of the isolation trenches. One bit line is connected with a plurality of second source/drain regions via the bit line contacts. Each capacitor contact is connected with the first source/drain region of a memory cell. Each storage capacitor contacts one of the capacitor contacts.

In particular, by forming the first openings in the substrate surface, an electrical isolation between adjacent memory cells of one row of the corresponding array is provided. Thereby, the active area is segmented.

In addition, by forming the second openings, the gate electrodes are defined. In addition, the vertical portions of the active areas in which the first and second source/drain portions are to be formed are defined. According to the present invention, the isolation trenches are formed after defining the vertical portions of the active areas in which the first and second source/drain portions are to be formed. As a consequence, the isolation trenches are formed in a self-aligned manner with respect to the first and second source/drain portions.

According to the invention, the first and second openings are defined using a hardmask comprising first, second and third stripes of a first, a second, and a third material, respectively. The first, second and third stripes are arranged parallel to each other, and each of the first, second and third material are etched selectively to each other.

Thereby, it is relatively easy to form the first and second openings in the correct position.

In addition, the depth of the first openings is equal to the depth of the isolation trenches. The depth is measured from the substrate surface.

Preferably, before forming the plurality of bit lines, the first and second source/drain regions are not masked, whereas all the remaining portions of the surface are covered by an isolating material.

Thereby, the bit lines contact the second source/drain regions of the transistors in a self-aligned manner.

According to the invention, forming the plurality of bit lines, for example, includes depositing at least one layer of a conductive material and patterning the at least one layer to form bit lines that contact the second source/drain regions of the transistors.

In addition, at least one layer is photolithographically patterned using a mask having a lines/spaces pattern. Thereby, the correct positioning of the mask is simplified since a mask having a lines/spaces pattern is relatively easier to handle and to position.

According to the invention, providing a conductive material, for example, includes comprises the steps of conformally depositing the conductive material and anisotropically etching the conductive material.

Preferably, the method of the invention further includes providing a first and a second lightly doped portions, after filling the isolation trenches with an isolating material. Filling the isolation trenches includes providing an isolating material in the second opening, and conducting an angled ion implantation step at an angle α between the substrate surface and a direction of the ions. Thereby, a predetermined substrate portion is implanted beneath the substrate surface.

The method of the invention, for example, includes removing the upper part of the isolating material from the isolation trenches to expose the upper part of the active area before providing the gate isolating layer. The gate isolating layer is formed on the exposed portions of the active area.

Thereby, a FINFET in which the channel has the shape of a ridge is formed.

In this case, providing first and second source/drain regions, for example, includes providing a first and a second lightly doped portions, after providing an isolating material on the top side of the gate electrodes and between the word lines of one isolation trench. Providing a first and a second lightly doped portions includes conducting an angled ion implantation step at an angle α between the substrate surface and a direction of the ions.

In particular, by conducting an angled ion implantation step, by adjusting the angle α, the doping profile of the doped portions can be adjusted. In particular, the depth and the distribution of the dopants in the active areas can be adjusted.

BRIEF DESCRIPTION OF THE DRAWINGS

The accompanying drawings are included to provide a further understanding of the present invention and are incorporated in and constitute a part of the specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 10 shows an exemplary layout of the memory cell array of the present invention.

DETAILED DESCRIPTION

Figure 1A:
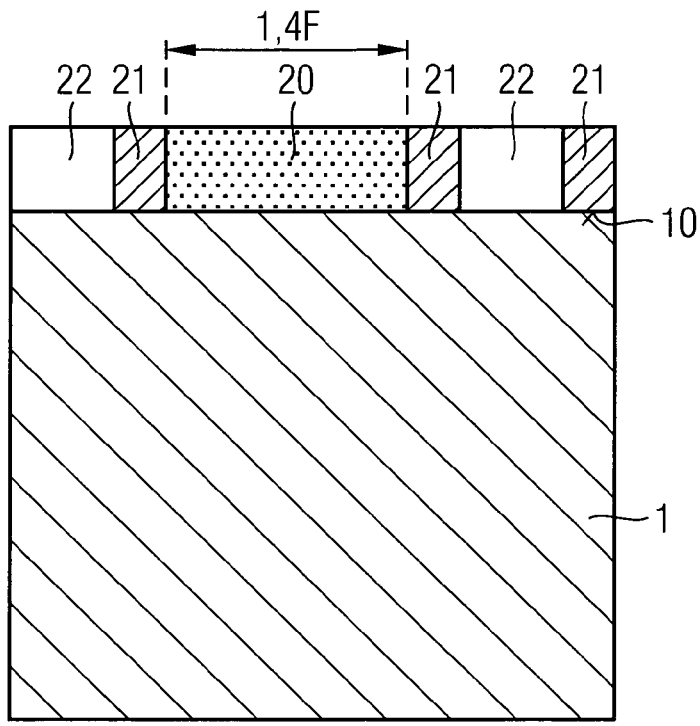
FIGS. 1A, 1B, 2, 3A-3C, 4A, 4B, 5A, 5B, 6A-6C, 7, 8, 9A, and 9B illustrate steps of a method of manufacturing a memory cell array according to a first embodiment of the present invention.

In the following detailed description, reference is made to accompanying drawings which form a part hereof and in which is illustrated by way of illustration, specific embodiments in which the invention may be practiced. In this regard, directional terminology, such as "top", "bottom", "front", "back", "leading", "trailing", etc., is used with reference to the orientation of the figures being described. Because components of the embodiments of the present invention can be positioned in a number of different orientations, the directional terminology is used for purposes of illustration and is no way limiting. It is to be understood that other embodiments may be utilized and structural or logical changes will be made without departing from the scope of the present invention. The following detailed description, therefore, is not to be taken in a limiting sense, and the scope of the present invention is defined by the appended claims.

For manufacturing the memory cell array of the present invention, first, a silicon dioxide ($SiO_2$) layer 20 having a thickness of 70 to 100 nm is deposited as a first hard mask layer. Thereafter, the $SiO_2$ layer 20 is photolithographically patterned using a mask having a lines/spacers pattern. In particular, for the first embodiment, the lithographic mask used has a pattern having a line width of 1.4 F and a space width of 1.2 F. In this regard, F denotes the minimum line width of the feature size which can be obtained by the technology used. In particular, F can be less than 100 nm and, in particular, 90, 70 or even 40 nm. Thereafter, a silicon nitride ($Si_3N_4$) layer 21 is conformally deposited by generally known methods. In particular, the $Si_3N_4$ layer 21 can have a thickness of approximately 0.3 F. Thereafter, an anisotropic etching step is performed to expose the horizontal portions of the silicon dioxide layer 20 and the silicon substrate 1. As a consequence, the sidewalls of the spaces of the $SiO_2$ layer 20 are covered by $Si_3N_4$ spacers 21.

In the next step, a nitridation step as is generally known is performed to provide a diffusion barrier. To be more specific, a thin $Si_3N_4$ layer is formed, for example, by exposing the substrate to a $NH_3$ atmosphere. This thin $Si_3N_4$ layer prevents boron atoms from outdiffusing from the BPSG layer in the next step.

Thereafter a BPSG layer is deposited by generally known methods, an annealing step is performed and thereafter a CMP step is conducted so that finally the structure shown in FIG. 1A is obtained.

In particular, FIG. 1A shows a cross-sectional view of the resulting structure. On the surface 10 of a semiconductor substrate 1, such as a silicon substrate, a stripe of a silicon dioxide layer 20 having a width of 1.4 F is formed. On both sides of the silicon dioxide layer 20, stripes 21 of a silicon nitride layer 21 are arranged, followed by stripes of a BPSG layer 22. In particular, the width of the silicon nitride stripes 21 is approximately 0.3 F, whereas the width of the stripes 22 of the BPSG layer is approximately 0.6 F.

Figure 1B:
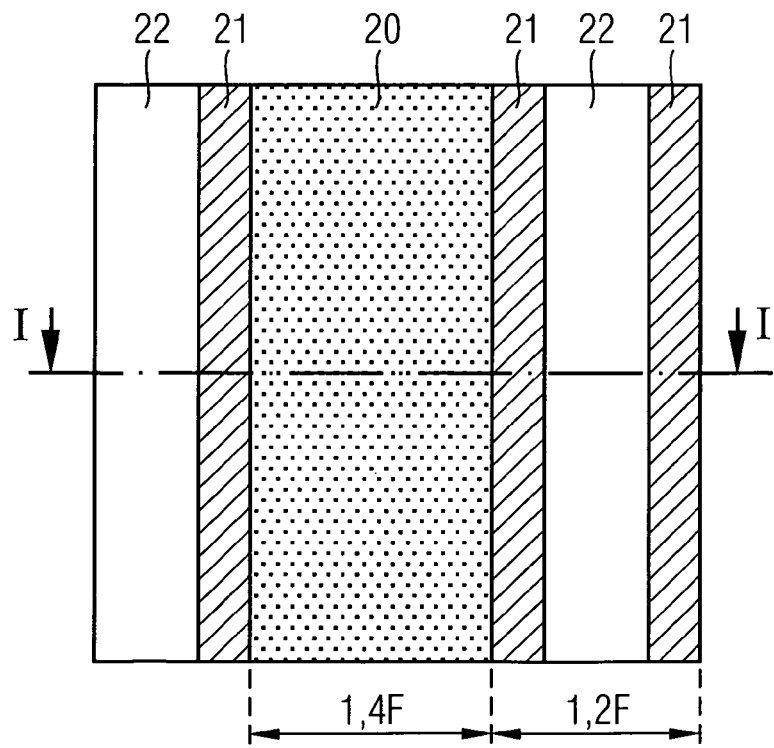

FIG. 1B shows a plan view of the resulting structure. As can be seen, the whole surface 10 of the semiconductor substrate 1 is covered by stripes of a silicon dioxide layer 20, parallel stripes 21 of a silicon nitride layer and parallel stripes 22 of a BPSG layer. As noted from FIG. 1B, the cross-sectional view of FIG. 1A is taken between I and I in FIG. 1B.

In the next step, the stripes of the BPSG layer 22 are etched selectively with respect to silicon dioxide. For example, an etching step in HF vapor can be used for etching the BPSG layer. In the next step, the silicon substrate is etched selectively with respect to silicon dioxide and silicon nitride to form first openings 11. In particular, a dry etching step as commonly used is performed so that the silicon material is etched anisotropically to a target depth of 1 F. In this etching step, the stripes of the silicon dioxide layer 20 and the silicon nitride layer 21 act as a hard mask.

Figure 2:
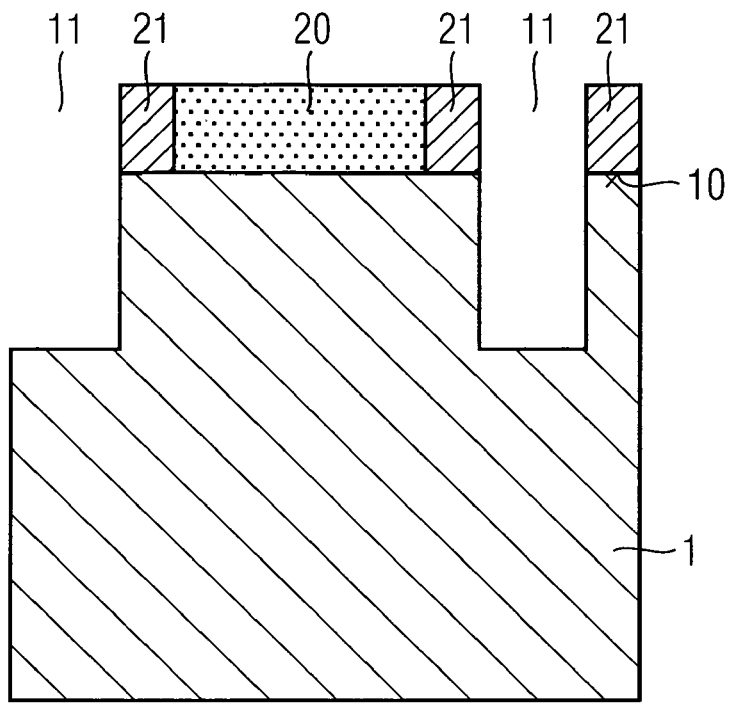

The resulting structure is shown in FIG. 2. In particular, FIG. 2 shows the first openings 11 etched in the silicon substrate material.

Figure 3A:
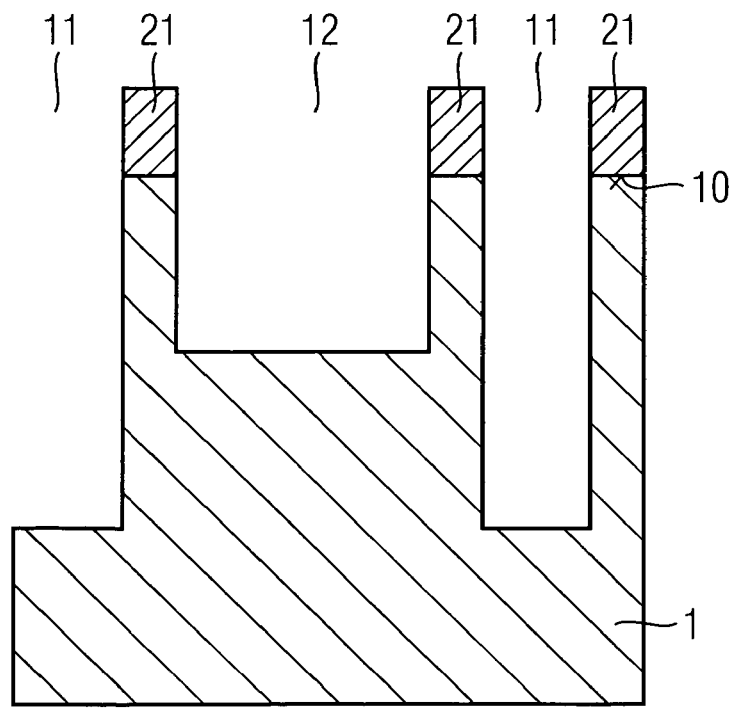

In the next step, the stripes of the silicon dioxide layer 20 are etched, for example, in buffered hydrofluoric acid (BHF). Thereafter, a dry etching step of etching silicon selectively with respect to silicon nitride is performed. Again, this etching step is an anisotropic etching step by which a further depth of 1 F is etched. As a result, the structure shown in FIG. 3A is obtained. In particular, in the cross-sectional view shown in FIG. 3A, by the last etching step, second openings 12 having a depth of 1 F are formed, whereas the first openings 11 now have a depth of 2 F.

In the next step, the active area lines are photolithographically defined. In particular, a bilayer resist material is applied on the structure shown in FIG. 3A. The bilayer resist usually includes two layers, a non-photoactive base layer and a photoactive top layer and into which the pattern to be formed is transferred by lithographic methods. By using a bilayer resist, problems caused by a topography of the wafer surface can be eliminated.

Figure 4A:
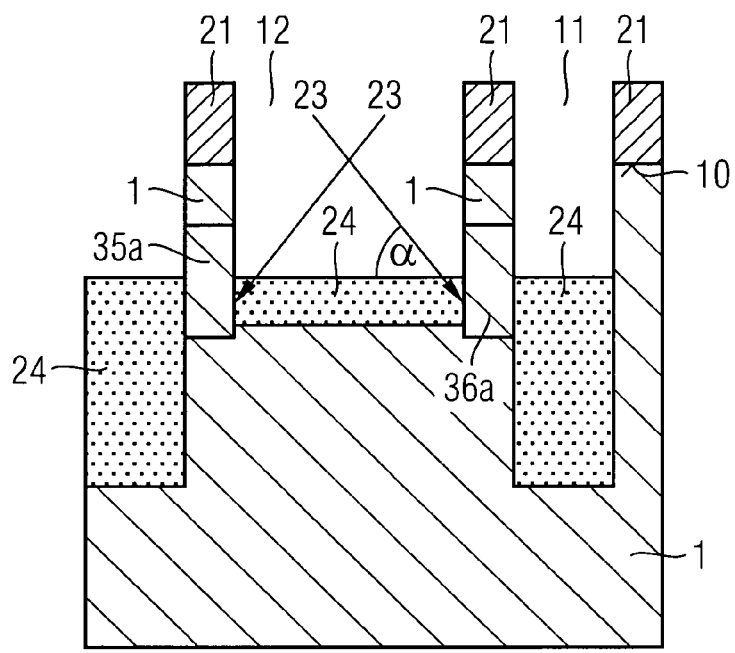

Thereafter a lithographic step using a mask having a lines/spaces pattern is performed to pattern the active areas. In particular, the lines/spaces mask is arranged parallel to the plane of the drawing shown in FIG. 3A so that the portions shown in FIG. 4A are masked by the bilayer resist. The mask used has a line width of 0.8 F and a space width of 1.7 F. Thereafter, an etching step of etching silicon nitride and silicon to a target depth of 2 F is performed.

Figure 3B:
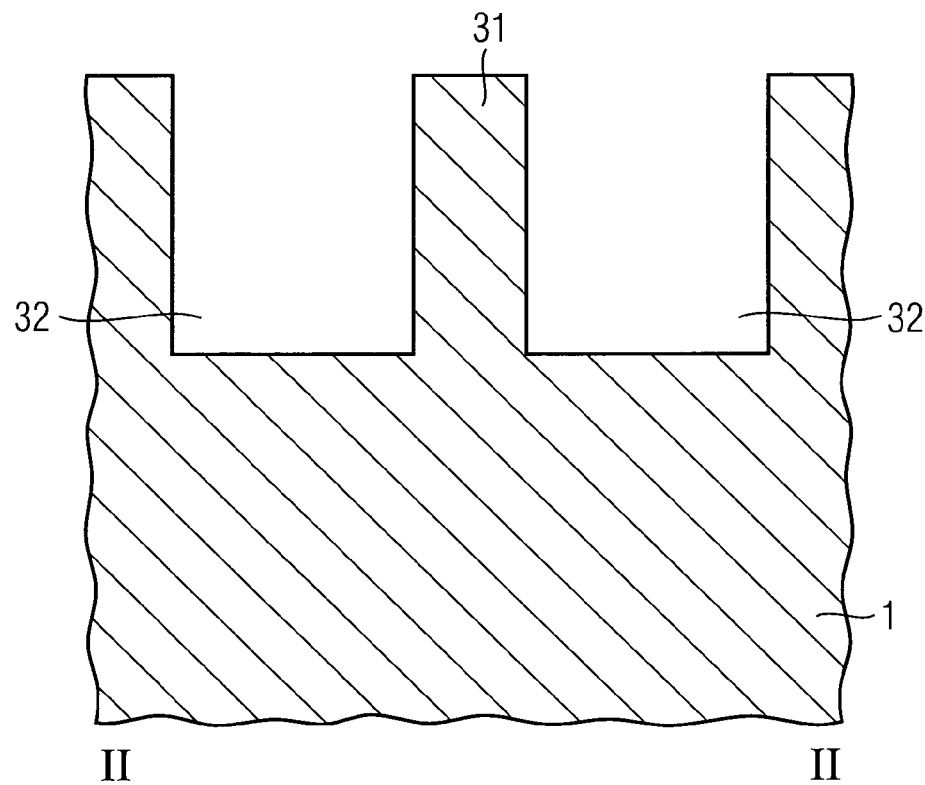

The resulting structure is shown in FIG. 3B. In particular, the cross-sectional view of FIG. 3B is taken perpendicular to the second openings 12 shown in FIG. 3A. The detailed position of the cross-sectional view between II and II can also be seen from FIG. 3C which shows a plan view on the resulting structure.

As can be seen from FIG. 3B, active areas 31 are now defined in the silicon substrate material 1, the active areas 31 being delimited on either sides by isolation trenches 32. Due to the lithographic mask used, the active area has a width of 0.8 F, whereas the isolation trenches have a width of 1.7 F.

Figure 3C:
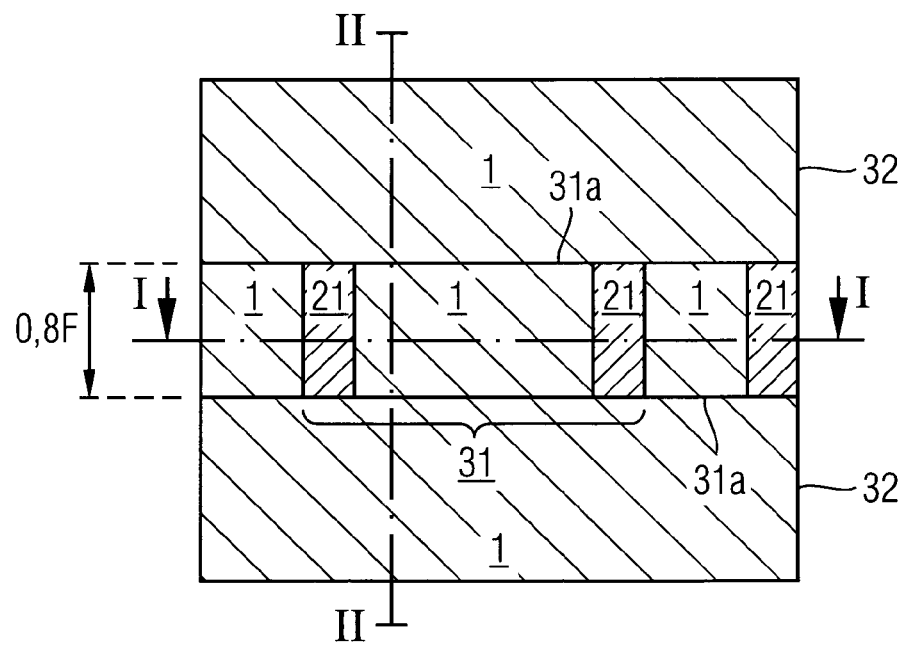

In addition FIG. 3C shows a plan view on the resulting structure. In particular, active area segments 31 are disposed in the middle of the shown plan view. Adjacent active area segments 31 are isolated from each other by the first openings 11. In addition, rows of active areas are isolated from each other by isolation trenches 32. The isolation trenches 32 are adjacent to the lateral sides 31a of the active areas.

In the next step the active areas are oxidized by usual methods and, thereafter, a silicon dioxide layer 24 is deposited, for example by a HDP (high density plasma) method or a conformal deposition method. Thereafter, a wet etching step, for example in buffered HF, is performed to recess 1.2 F depth of the deposited silicon dioxide layer 24. For example, the thickness of the remaining $SiO_2$ material over the channel may be 0.3 F. Thereafter, an ion implantation step is performed to provide the first and second LDD regions 35a, 36a, i.e., the portions of the source/drain regions having a low doping concentration.

This implantation step is performed as an angled implantation step 23, as is also illustrated in FIG. 4A, using the silicon dioxide layer 24 over the channel region as a shielding layer so that only predetermined portions of the silicon substrate between the first and the second openings 11, 12 are doped.

In particular, an angle α between the substrate surface and the direction of the ion bombardment should be approximately 20 to 70° and, in particular, 30 to 60°. By adjusting the angle of the ion implantation, the penetration depth and, consequently, the doping profile can be adjusted to a predetermined one.

Figure 17:
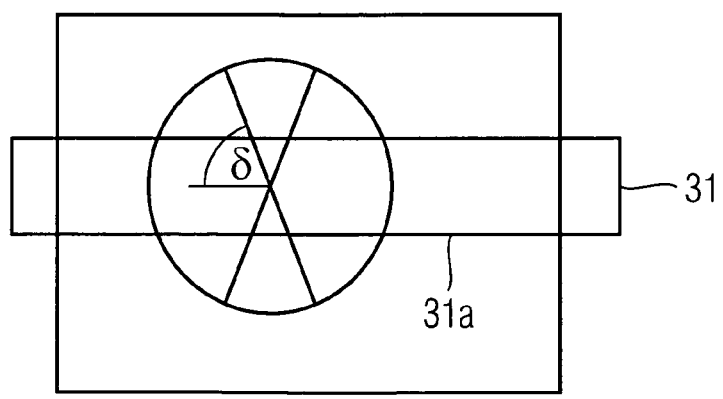
FIG. 17 shows a diagrammatic view for illustrating the angled implantation step.

Moreover, an angle δ defining a twist angle between the implanted ions and the direction of the lateral sides 31a of the active area can be adjusted. The angle δ is illustrated in FIG. 17. In a dual mode ion implantation step in which the ion implantation is conducted from two directions differing by 180°, the angle δ can be 0 and 90°. In a quad mode ion implantation step in which the ion implantation is performed from four directions differing by 90°, the angle δ can be 45°, 135°, 225° or 315°. Alternatively, in a quad mode ion implantation step, the angle δ can be 60°, 120°, 240° or 300°.

In particular, a doping of the channel region, which is beneath the second opening 12, should be avoided. The resulting structure is shown in FIG. 4A. As can be seen, the lower portion of the first openings 11 is filled with the silicon dioxide layer 24 and the portion of the silicon substrate in which the channel of the transistor is formed is covered by the silicon dioxide layer 24.

Figure 4B:
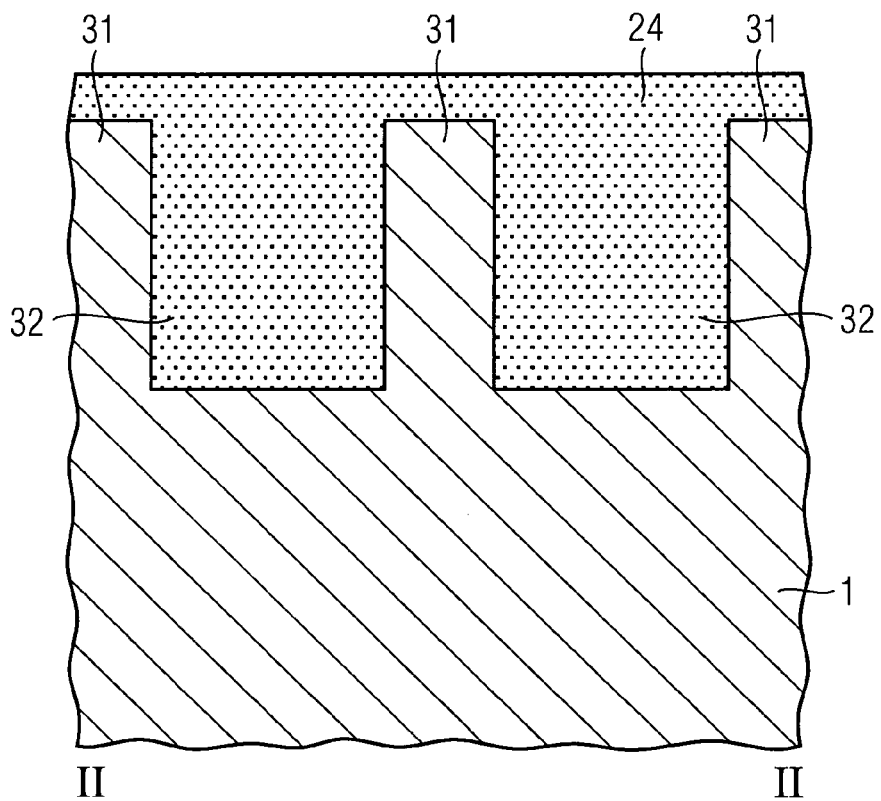

FIG. 4B shows a cross-sectional view taken perpendicular to the cross-sectional view in FIG. 4A to intersect the second openings 12. As can be seen from FIG. 4B, the silicon dioxide layer 24 is deposited to completely cover the active area 3 as well as to fill the isolation trenches 32.

In the next step, the $SiO_2$ layer 24 is further recessed. Thereafter, a silicon dioxide layer 26 having a thickness of 0.2 F is conformally deposited. Thereafter, an anisotropic etching step is performed. Thereby, sidewall spacers covering the lateral portions of the second openings 12 are formed. In addition, due to their narrow width, the first openings 11 are filled with $SiO_2$ material 26. By the etching depth of this step, the amount of side gating, i.e., the interaction of the gate electrode on the first and second source/drain regions of the resultant transistor is adjusted.

As a modification, this step can be performed to remove the side wall spacers in the second openings 12, whereas the silicon dioxide layer 26 is maintained in the first openings 11 due to their narrow width. In addition, according to a further modification, the width of the silicon portions between the first and the second openings in which later the source/drain regions will be formed, can be larger than in the shown embodiment.

Figure 5A:
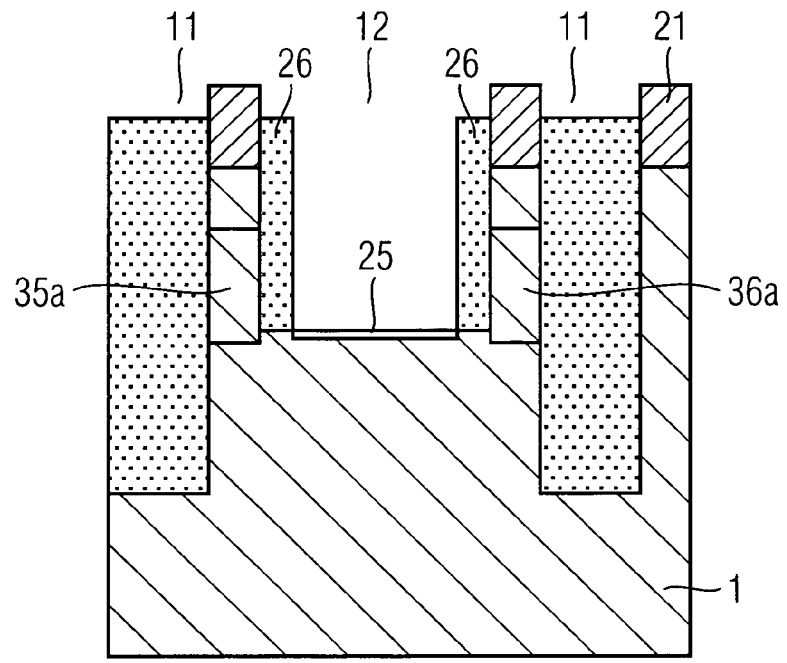

Thereafter, a cleaning step with SC1 ($NH_4OH/H_2O_2/H_2O$) or SC2 ($H_2O_2/HCl/H_2O$) is performed to remove etch damages from the channel. Thereafter, a gate oxide layer 25 is formed by generally known methods. In particular, an ISSG (in-situ steam generated) silicon dioxide layer can be formed or a HTO (high temperature oxide) can be formed. The resulting structure is shown in FIG. 5A. As can be seen, in the bottom portion of the second openings 12, the gate oxide 25 is formed. The side walls of the second openings are covered by the silicon dioxide layer 26, and the first openings are completely filled with silicon dioxide material 26.

Figure 5B:
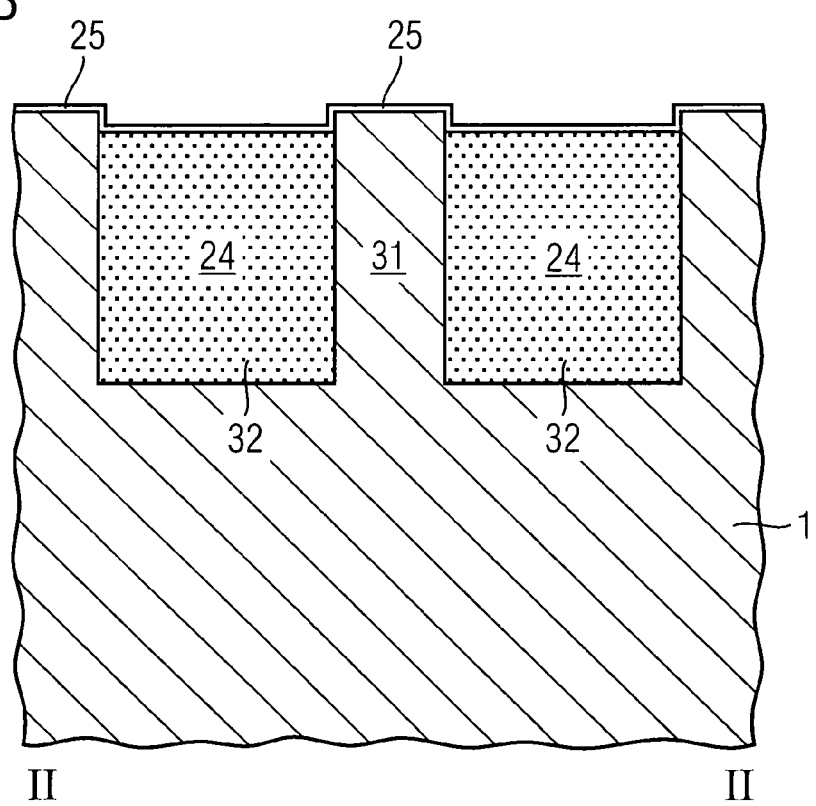

FIG. 5B shows a cross-sectional view taken perpendicular to the plane shown in FIG. 5A across the second openings 12.

As can be seen from FIG. 5B, the isolation trenches 32 are filled with the silicon dioxide layer 24 up to a height beneath the height of the active areas 31. The active areas are covered by the gate oxide layer 25.

In the next step, a doped poly-silicon layer is conformally deposited above the resulting structure to have a thickness of 0.6 F. Thereafter, an anisotropic spacer etching step is performed to approximately 0.3 F below the silicon substrate surface 10. An over-etching to 0.8 F below the surface of the silicon substitute can be performed, depending on the thickness of the silicon nitride layer 21.

By this step, the gate electrodes 33 and the word lines 34 are formed.

Figure 6A:
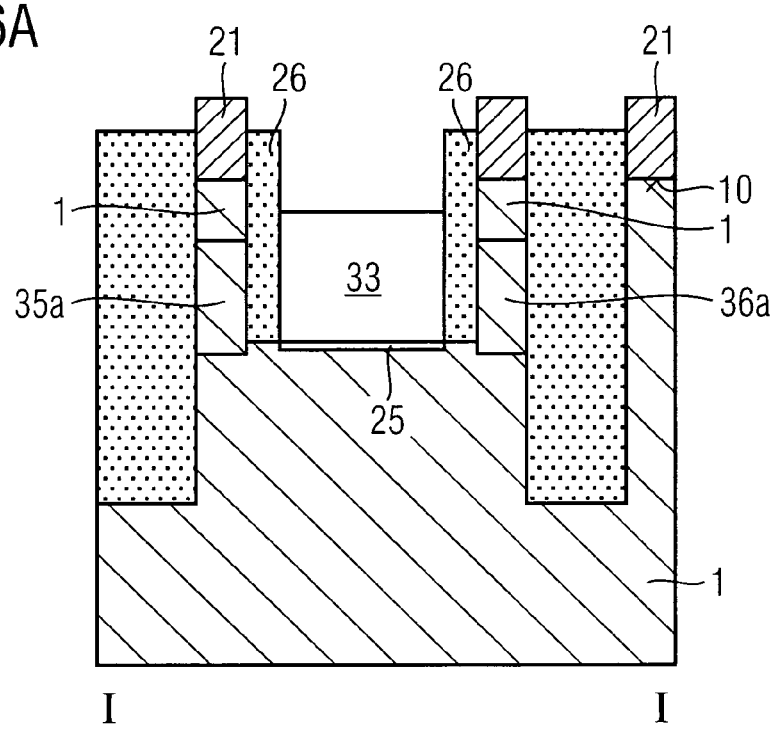
Figure 6B:
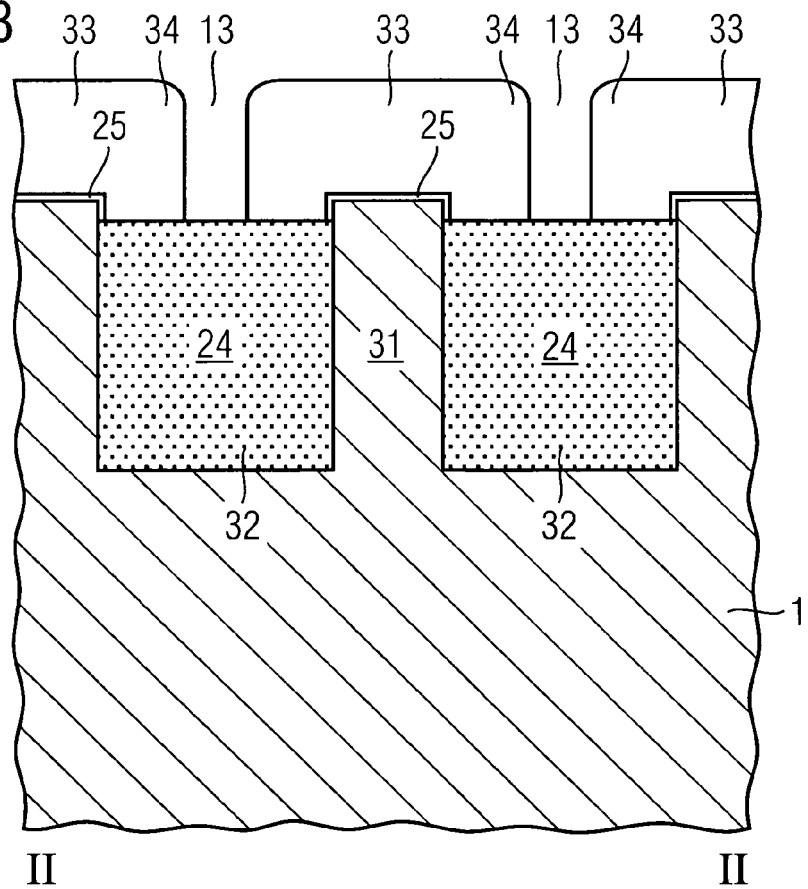
Figure 6C:
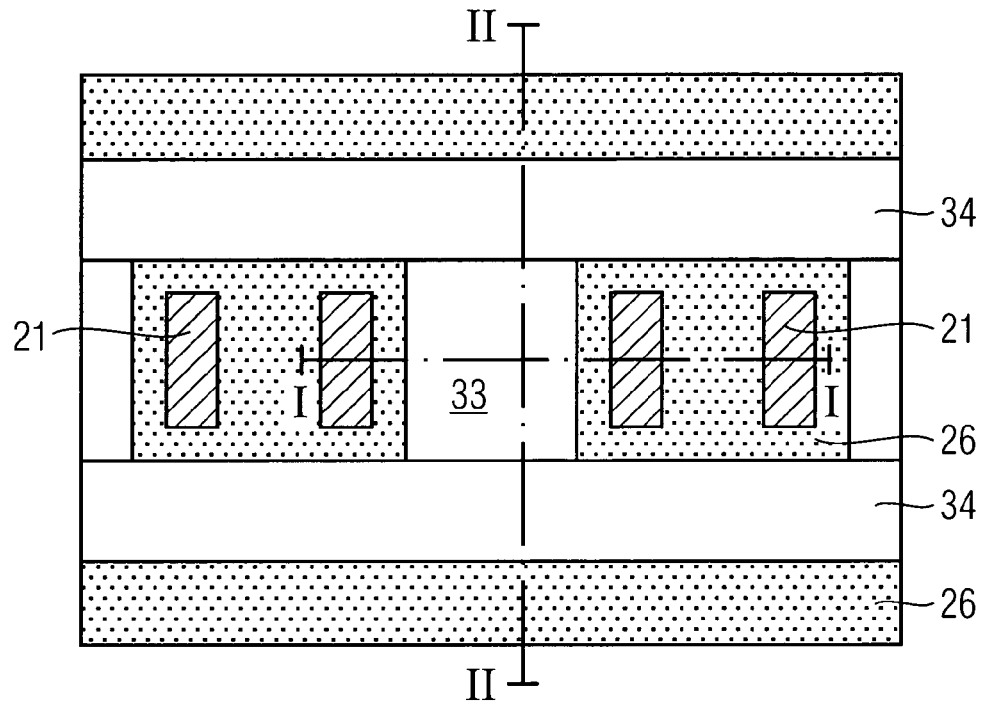

The resulting structure is shown in FIGS. 6A-6C. In particular, FIG. 6A shows a cross-sectional view between I and I as can, for example, be seen from FIG. 6C showing a plan view on the resulting structure. Moreover, FIG. 6B shows a cross-sectional view between II and II as can be taken from FIG. 6C.

In particular, as is shown in FIG. 6A, a gate electrode 33 is formed above the silicon dioxide layer 25. The first and second LDD portions 35a, 36a as well as the substrate material 1 above are isolated from the gate electrode 33 by the silicon dioxide spacer 26. The channel region is isolated from the gate electrode 33 by the gate oxide 25. Adjacent memory cells belonging to one active area line are electrically isolated from each other by the spacer 26 which is formed in the first openings 11.

In addition, FIG. 6B shows a cross-sectional view which is taken in a direction perpendicular to the cross-sectional view of FIG. 6A intersecting the second opening 12. As can be seen from FIG. 6B, the gate electrode 33 is disposed above the active area 31 and electrically isolated therefrom by the gate oxide 25. On the side walls of the isolation trenches 32 the word lines 34 are formed by the spacer process as described above. Adjacent word lines 34 are electrically isolated from each other due to the openings 13 formed during the spacer process as described above.

FIG. 6C shows a plan view on the resulting structure. As can be seen, the gate electrode 33 is disposed in the middle of the drawing and electrically connected with the word lines 34. In particular, two word lines 34 are adjacent to the row of active areas, wherein the two word lines 34 are connected with each other via the gate electrode 33.

In the next step, a silicon dioxide layer 27 is deposited. Thereafter, a CMP (chemical mechanical polishing) step is performed. By these steps, in particular the openings 13 as shown in FIG. 6B between adjacent word lines are filled with an isolating material. In the next step, the segments of the silicon nitride layer 21 are etched. Thereafter, an implantation step for defining the first and second source/drain regions 35, 36 having a high doping concentration is performed. The resulting structure is shown in FIG. 7.

Figure 7:
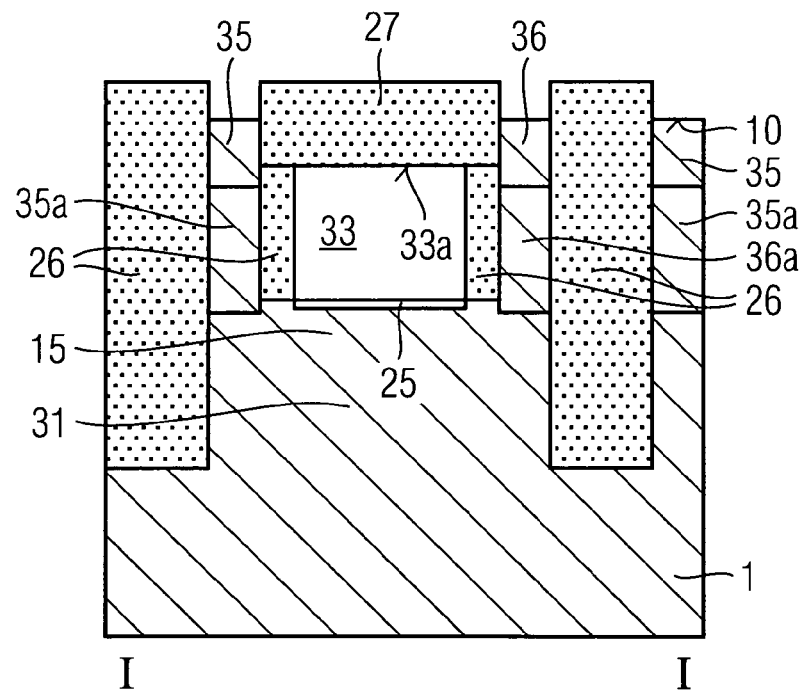

As can be seen from FIG. 7, the resulting transistor now comprises a first and a second source/drain regions 35, 36 as well as a first LDD portion 35a and a second LDD portion 36a. A channel 15 is formed between the first and the second LDD portions 35a, 36a. A gate electrode 33 is formed above the channel, and is electrically isolated from the channel 15 by the gate oxide layer 25. Side wall spacers 26 are formed between the gate electrode 33 and the first and the second source/drain regions 35 and 36. In particular, the side wall spacers 26 minimize an influence of the potential of the gate electrode on the source/drain regions 35, 36. The gate electrode 33 is covered by a silicon dioxide layer 27. The gate electrode 33 is disposed beneath the surface 10 of the semiconductor substrate 1. In particular, the top surface 33a of the gate electrode is disposed beneath the surface 10 of the semiconductor substrate 1. In addition, the bottom surface 33b of the gate electrode is disposed on the relatively same height or at a relatively smaller depth than the bottom side of the first and second LDD portions 35a, 36a. Differently speaking, preferably at least one of the first and second LDD portions 35a, 36a extends to a deeper depth than the gate electrode 33.

In the next step, the bit lines are formed on the resulting surface. In particular, a polysilicon layer 38 and a high conductive layer such as a WSix layer 39 followed by a $Si_3N_4$ layer 46, are deposited. Thereafter, a lithographic step is performed to define the bit lines and the bit line contacts. In particular, a mask having a lines/spaces pattern is used for defining the bit lines. Thereafter, the poly-silicon layer 38 and the high conductive layer 39 are etched to form conductive lines.

In particular, since the whole substrate surface, except for the portions over which the silicon nitride segments 21 are present is covered by the silicon dioxide layer, bit line contacts are defined using a mask having a lines/spaces pattern.

In the next step, a silicon nitride layer 40 is conformally deposited. Then, an anisotropic etching step is performed to provide silicon nitride spacers 40. In the next step, a SiON liner is deposited, followed by a step of depositing a BPSG layer. Thereafter, a further CMP step is performed to obtain the BPSG portions 41. In the next step, a capacitor contact 42 is photolithographically defined, etched, and filled with a conducting material such as poly-silicon. For example, the capacitor contact can be defined by using a hole mask, or other method as known in the art.

Figure 8:
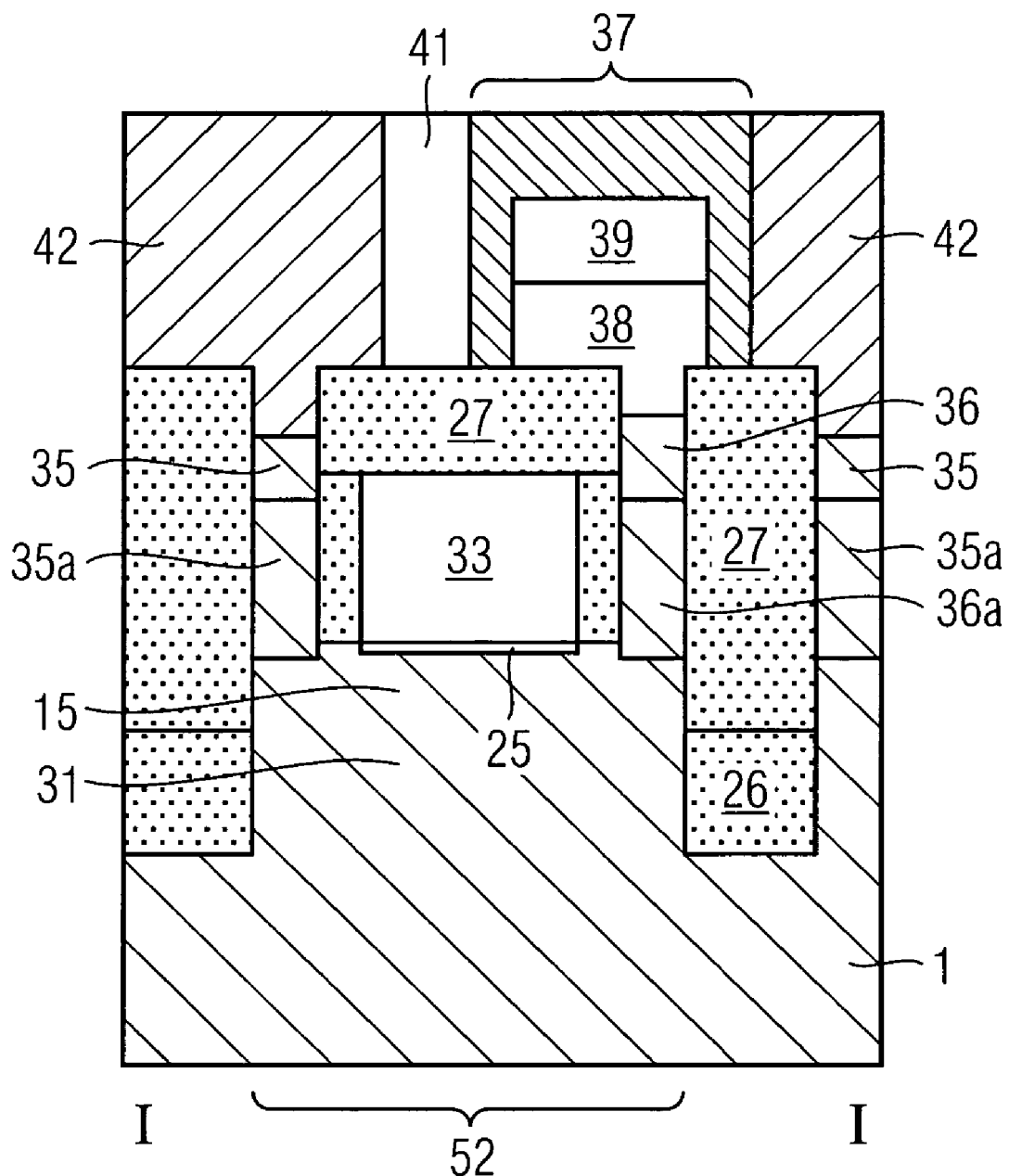

FIG. 8 shows the resulting structure. The second source/drain region 36 is connected with a bit line 37, whereas the first source/drain region 35 is connected with a capacitor contact 42. The word lines extend in a direction which is parallel to the direction given by the lines connecting first and second source/drain regions 35 and 36. The word lines are disposed in a plane which lies before and behind the illustrated cross-sectional view.

Figure 9A:
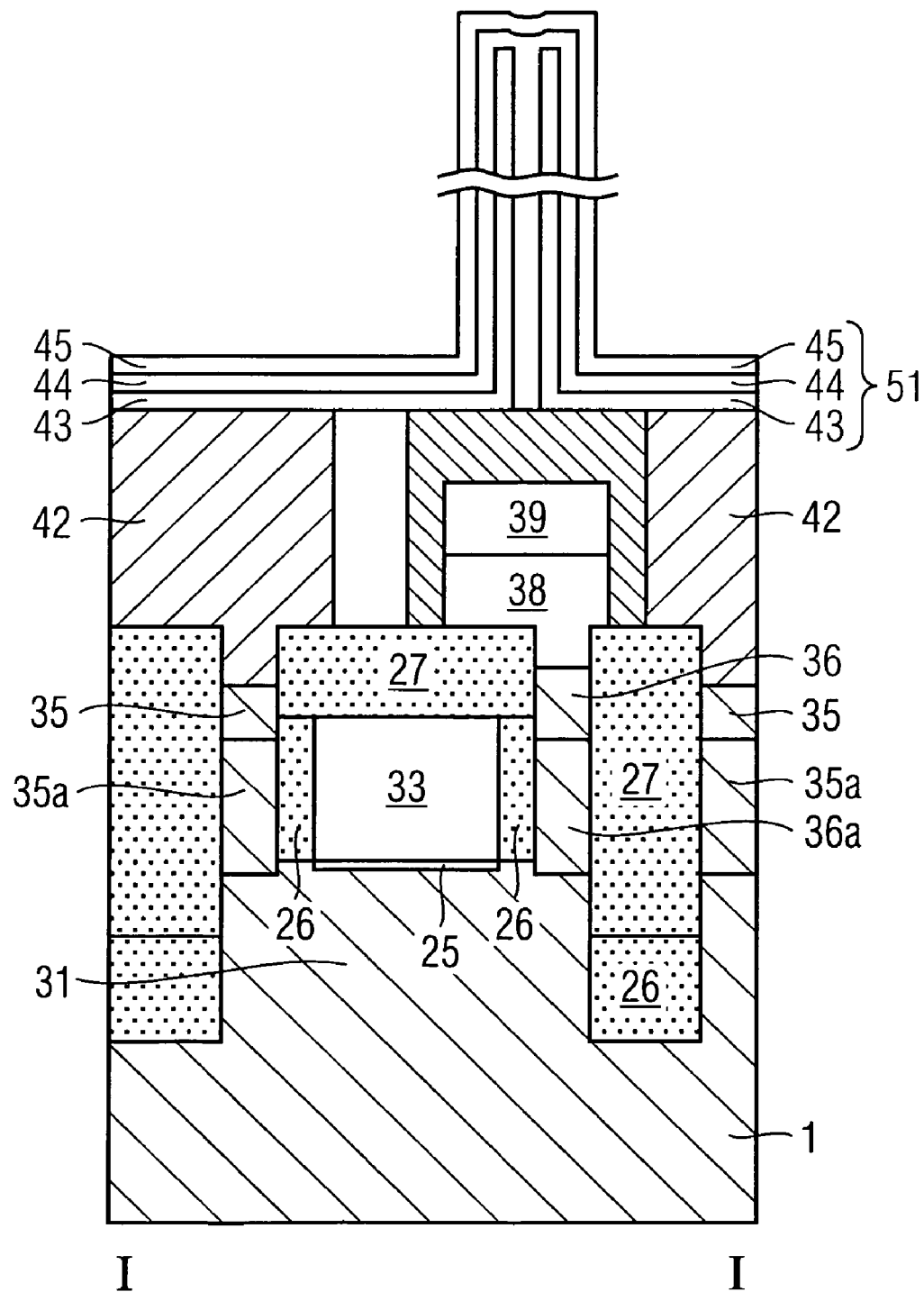
Figure 9B:
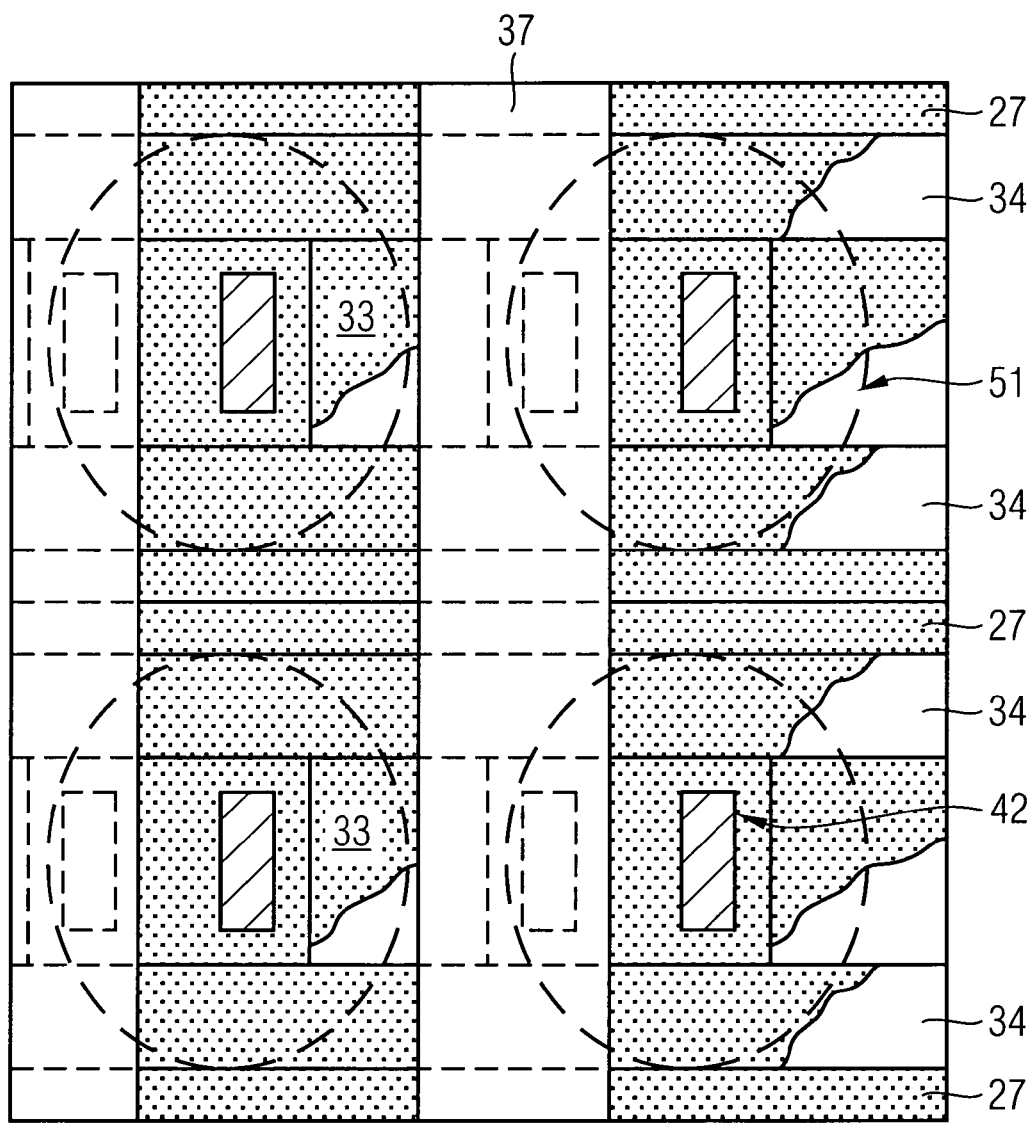

In the next step, the conventional process steps for forming a stacked capacitor are conducted. The stacked capacitor 51 which can be used with the transistor as described above can have any shape. For example, the stacked capacitor 51 it can have the construction as shown in FIG. 9A. In particular, the storage capacitor 51 includes a storage electrode 43, a capacitor dielectric 44, and a counter-electrode 45. The storage electrode 43 is connected with a capacitor contact 42. FIG. 9B shows a plan view on the resulting memory cell array. As can be seen from FIG. 9B, a plurality of bit lines 37 are arranged in a first direction, whereas a plurality of word lines 34 are arranged in a second direction which can, in particular, be perpendicular to the first direction. Each of the word lines is connected with a plurality of gate electrodes 33. In particular, one row of memory cells is addressed by two parallel word lines 34 which are held on the same potential. Neighboring word lines which address different rows of memory cells are electrically isolated from each other by the silicon dioxide layer 27. Each of the memory cells includes a stacked capacitor 51 connected with a first source/drain region 35 of the corresponding transistor via a capacitor contact 42.

FIG. 10 shows a simplified schematic diagram describing a pair of memory cell arrays 60, 60'. Each memory cell include an access transistor 52 and a storage capacitor 51 in accordance with the present invention. The arrays are implemented in an open bit line configuration. Each has memory cells 50, which includes one transistor 52 and one capacitor 51.

The memory arrays 60, 60' are each coupled to respective groups of bit lines 37, 37' and respective groups of word lines 34a, 34b, 34a', 34b'. The two groups of bit lines 37, 37' are coupled, one from each of the memory arrays 60, 60' to sense amplifiers 6. The sense amplifiers 6 include peripheral circuitry, generally formed outside of the memory cell arrays 60, 60'.

In operation, one memory cell 6 is selected, for example, by activating one pair of word lines 34a, 34b. The word lines of one pair are held at the same potential. The pair of word lines 34a, 34b is coupled to the respective gate electrode of a respective one of the transistors 52. The bit line 37 is coupled to the second source/drain region of one of these transistors 52 via bit line contacts. The transistor 52 is turned on by coupling charge stored in the capacitor 51 to the associated bit line 37. The sense amplifier 6 then senses the charge coupled from the capacitor 51 to the bit line 37. The sense amplifier 6 compares that signal to a reference signal, such as the reference charge Qref or a reference signal obtained by sensing a corresponding bit line 37', without a voltage being applied to the corresponding pair of word lines 34a', 34b', and amplifies the resulting signal. This allows data represented by the charge stored in the capacitor 51 to be accessed external to the memory arrays 60, 60' and allows the capacitor 51 to store charge representative of the data from the memory cell 50 back into the memory cell 50.

In the shown layout of the first embodiment, the capacitor covers an area of 2.4·1.8 $F^2$, and the cell size is 2.6 F length·3 F width.

According to a second embodiment of the present invention a smaller cell size is obtained. In addition, according to the second embodiment, the active area has the shape of a ridge, wherein the gate-electrode is disposed on three sides thereof. As is obvious to the person skilled in the art, the transistor has the shape of such a FINFET can be implemented with any arbitrary cell size.

For implementing the second embodiment, a silicon dioxide layer 20 is deposited on the surface 10 of the semiconductor substrate 1. Thereafter, the lithographic step is performed using a mask having a lines/spaces pattern. In contrast to the first embodiment, the line width is 0.8 F whereas the space width is 1.2 F. After etching the spaces, a silicon nitride layer is deposited by generally known methods and etched to have a width of 0.3 F. Thereby, stripes 21 of a silicon nitride layer are formed. In a next step, a nitridation step for providing a diffusion barrier is performed, followed by depositing a BPSG layer. The BPSG layer is annealed, and thereafter, a CMP step is performed.

Figure 11A:
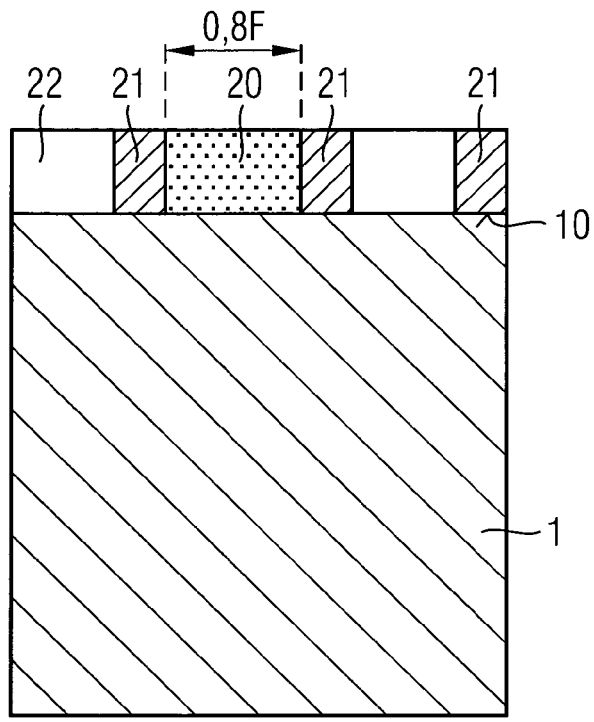
FIGS. 11A, 11B, 12A, 12B, 13A, 13B, 14A-14C, and 15 illustrate steps of a method of manufacturing a memory cell array according to a second embodiment of the present invention.
Figure 11B:
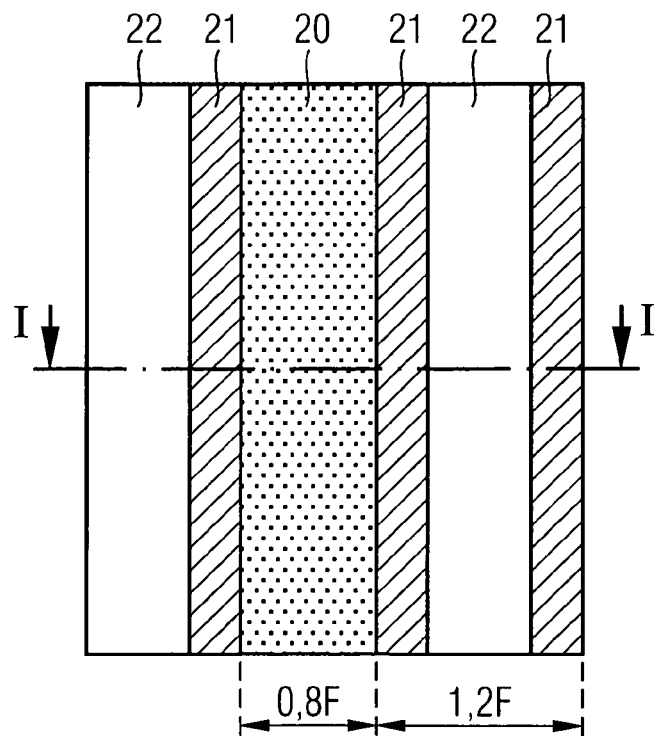

As a result, the structure shown in FIGS. 11A and 11B is obtained. As can be seen from FIG. 11B, in a similar manner as in FIG. 1B, the surface of the semiconductor substrate now is covered by stripes of a $SiO_2$ layer 20, which is delimited on either sides by $Si_3N_4$ stripes 21, two $Si_3N_4$ stripes 21 enclosing one BPSG stripe 22. The width of the $SiO_2$ lines 20 amounts to 0.8 F. In the following, the process steps which have been described with reference to FIGS. 2 and 3A-3C are performed and a description thereof is omitted. After etching the isolation trenches to define the active areas, a silicon dioxide layer 24 is formed in the same manner as has been described above.

After filling the isolation trenches with the silicon dioxide layer 24, an etching step is performed, for example in buffered HF to expose the channel region.

Figure 12A:
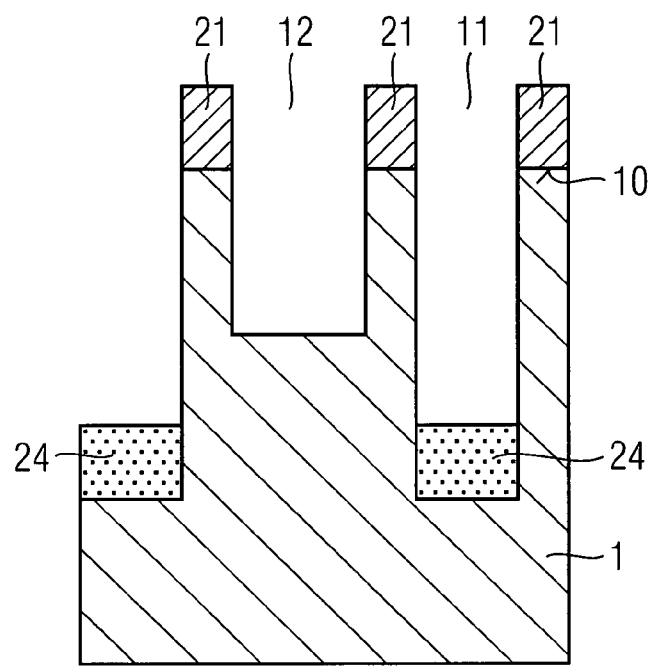
Figure 12B:
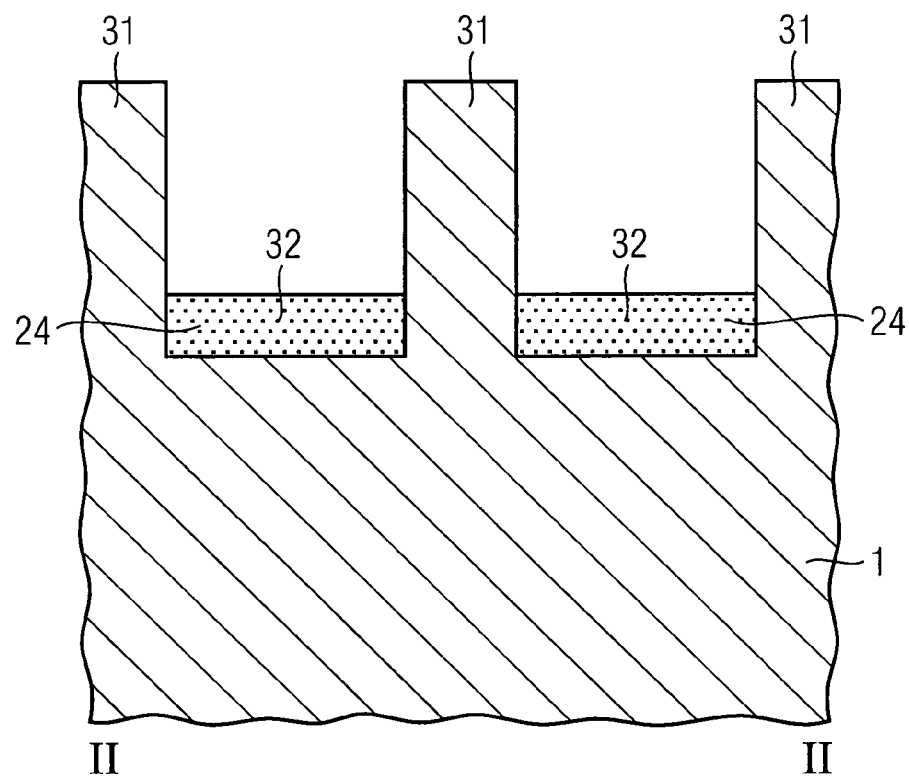

The resulting structure is shown in FIGS. 12A and 12B. In particular, FIG. 12A shows a cross-section between I and I similar to the cross-sectional view shown in FIG. 4A except for the lateral dimensions of the first and second openings 11, 12, respectively. As can be seen from FIG. 12A, the silicon dioxide material which has been filled in the first openings 11, is removed in the upper portion of the first openings 11. As can be also seen from FIG. 12B, the isolating material 24 in the isolation trenches 32 now only is present in the lower portion thereof.

Thereafter, a silicon dioxide layer 26, having a thickness of 0.2 F is conformally deposited. Then, an anisotropic etching step is performed. Thereby, sidewall spacers covering the lateral portions of the second openings 12 are formed. These steps of forming the sidewall spacers by conformally depositing a silicon dioxide layer and subsequently performing an anisotropic etching step are optional process steps which can as well be omitted.

Figure 13A:
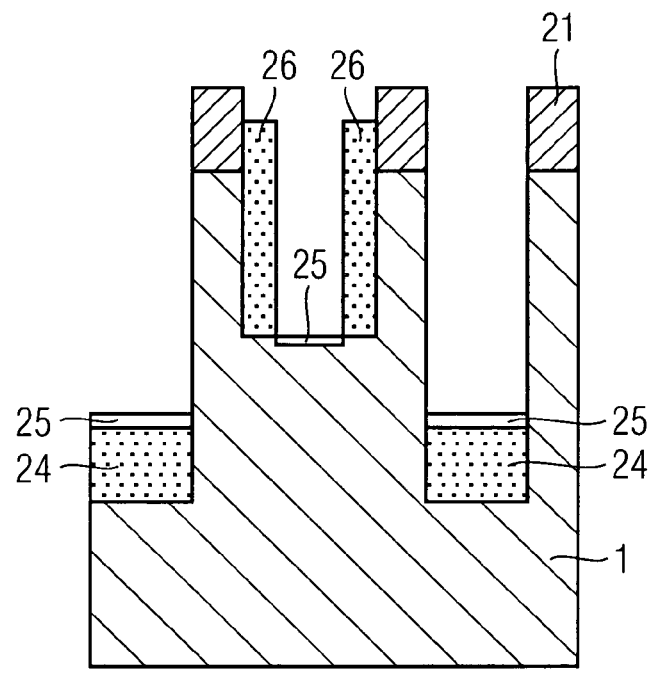

In the next step, a cleaning step with SC1 or SC2 is performed to remove etch damages from the channel. Then, a gate oxide layer 25 is formed in the same manner as has been described with respect to FIG. 5A. The resulting structure is shown in FIG. 13A.

Figure 13B:
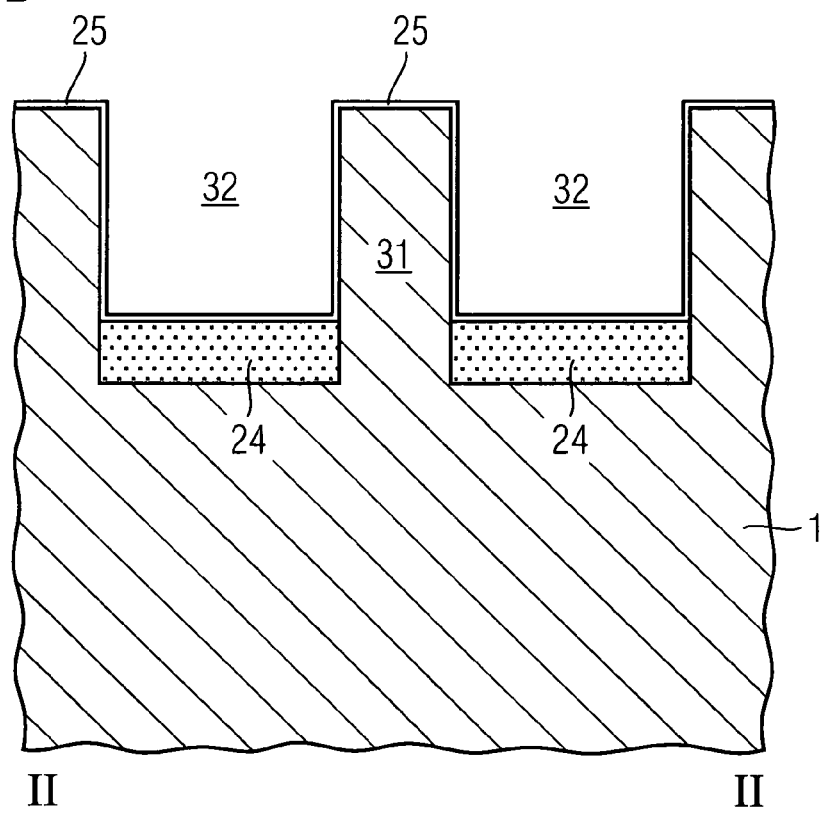

FIG. 13B shows a cross-sectional view of the resulting structure, this cross-sectional view being taken perpendicular to the active area 31. The silicon dioxide material 24 provided in the isolation trenches 32 now is recessed, and a thin gate oxide layer 25 is provided on the sidewalls of the active area 31.

In the next step, a doped poly-silicon layer is conformally deposited above the resulting structure to have a thickness of 05 F. Thereafter, an anisotropic spacer etching step is performed to 0.3 F below the silicon substrate surface 10. This etching step is performed in a similar manner as the etching process which has been described with reference to FIG. 6A. By this step, the gate electrodes 33 as well as the word lines 34 are formed.

Figure 14A:
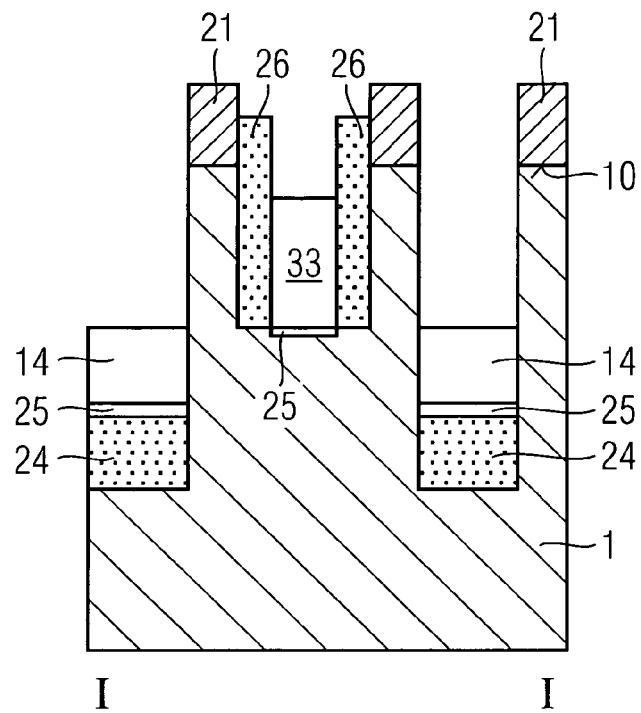
Figure 14B:
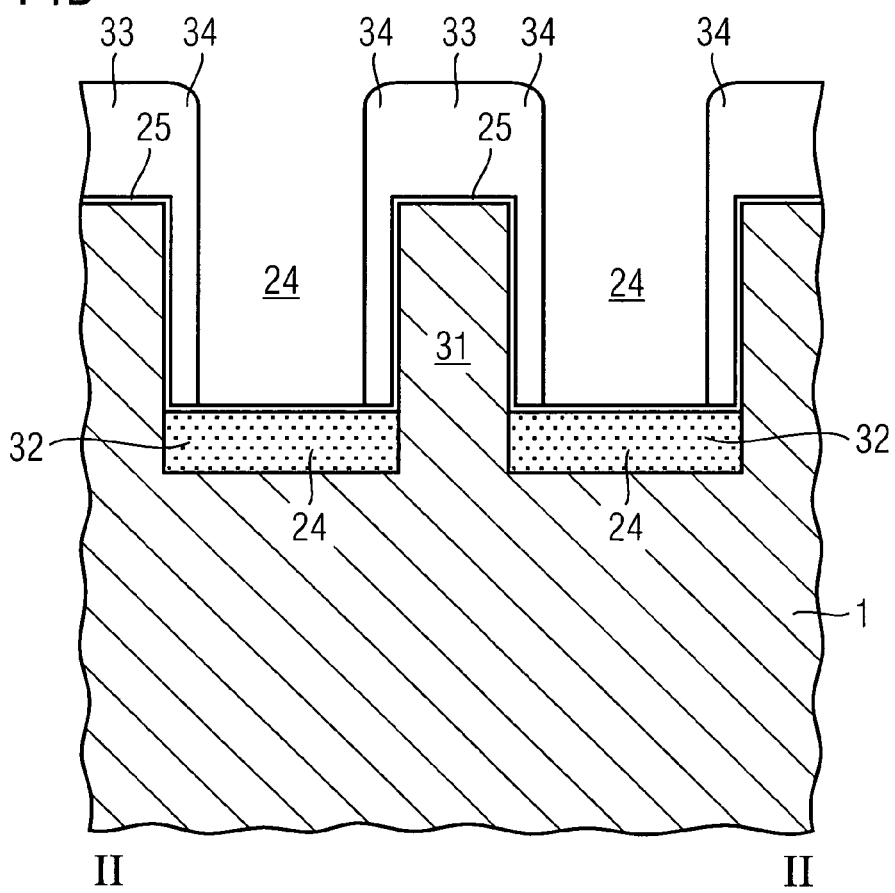
Figure 14C:
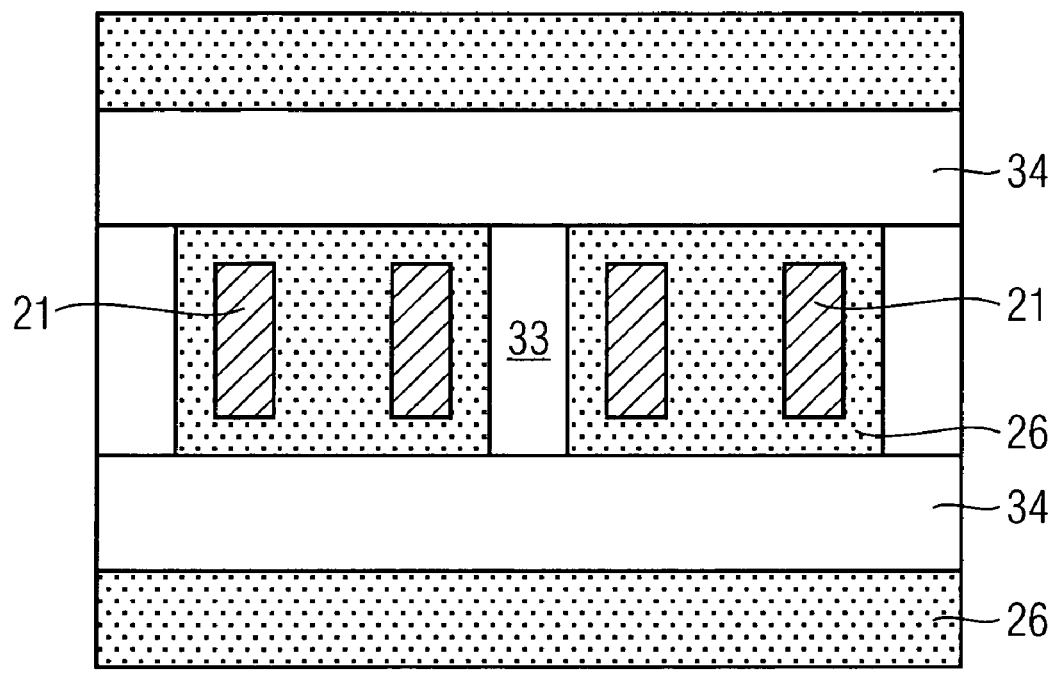

The resulting structure is shown in FIGS. 14A-14C.

As can in particular be gathered from FIG. 14B, now the active area is enclosed on three sides thereof by the gate electrode 33 and the corresponding word lines 34.

FIG. 14C shows a plan view on the resulting memory cell array. As can be seen, the gate electrode 33 is disposed in the middle of the drawing and electrically connected with the word lines 34. In particular, two word lines 34 are adjacent to the row of active areas, wherein the two word lines 34 are connected with each other via the gate electrode 33.

Thereafter, a self-aligned source/drain ion implantation step is performed to provide the first and second source/drain regions 35, 36 including the first and second portions having a low doping concentration 35a, 36a. In particular, the ion implantation step for providing the portions having a low doping concentration is also performed with an angled implantation, as has been described before, wherein the gate electrodes 33 are used as a shielding layer. In particular, the angles α and δ can be adjusted in the manner as described above with reference to FIGS. 4A and 4B. In this respect, if a certain value of the angle δ is adjusted and the sidewalls of the portion to be implanted are covered by a shielding layer, the effective thickness of the shielding layer depends on the twist angle δ.

Thereafter, the ion implantation step for providing the portions having a high doping concentration is performed in a conventional manner, in particular, by a perpendicular ion implantation.

Figure 15:
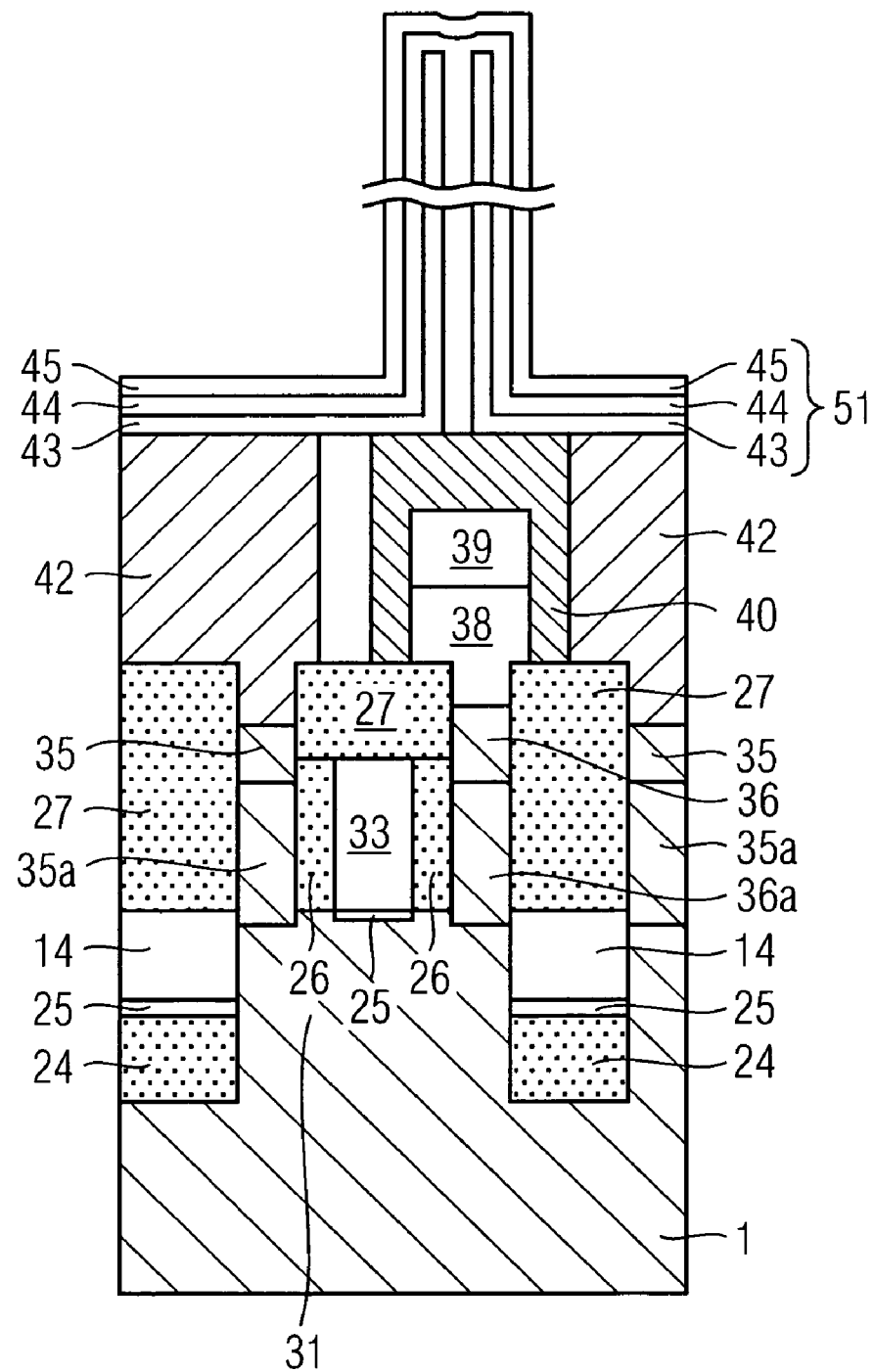

Thereafter, the same process steps which have been described with reference to FIGS. 7 to 9B are performed. Finally, the structure shown in FIG. 15 is obtained. In particular, the capacitor has a lateral dimension of 1.7·2 F, and the cell size is 2 F length·2.3 F width, resulting in a cell area of 4.6 $F^2$.

As can be seen from the cross-sectional view of FIG. 14B, the transistor now is a FINFET-type transistor having a channel in the shape of a ridge. Accordingly, the effective width of the channel is enlarged. At the same time, due to the narrow width of the ridge, the channel can be fully depleted.

Figure 16:
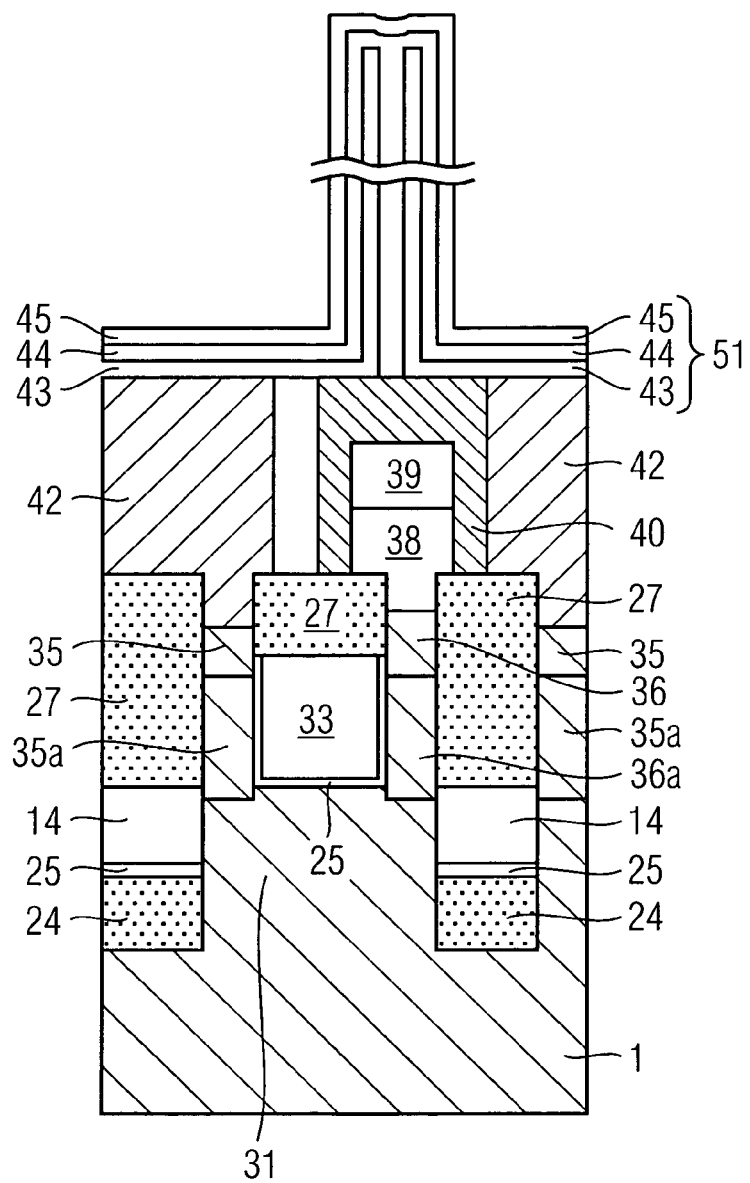
FIG. 16 shows part of a memory cell array according to a further embodiment of the present invention.

In addition, FIG. 16 shows a cross-sectional view of the memory cell in which the spacer which is shown in FIG. 15 is omitted and replaced by a gate isolating layer 25.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit comprising:
a plurality of active areas formed in a semiconductor substrate with a substrate surface, each active area having two lateral sides extending along a first direction with rows of active areas being separated from each other by isolation grooves, wherein each active area includes a first source/drain region formed adjacent the substrate surface, a second source/drain region formed adjacent the substrate surface, and a channel region separating the first and second source/drain regions, each of the first and second source/drain regions being distanced from and oriented with respect to each other along the first direction; and
gate electrodes disposed along the channel regions and being electrically isolated from the channel regions by gate isolating layers; and
a plurality of sets of first and second word lines disposed on opposing lateral sides of each of the rows of active areas and with each of the first and second word lines including a length that extends along the first direction, wherein the first and second word lines of each set are connected with each other via the gate electrodes of a corresponding row of active areas.

2. The integrated circuit according to claim 1, wherein each of the gate electrodes has a top side, the top side of the gate electrode being disposed beneath the surface of the semiconductor substrate.

3. The integrated circuit according to claim 1, wherein each channel region includes a fin-region in which the channel region has the shape of a ridge, the ridge includes a top side and two lateral sides in a cross section perpendicular to a line connecting the first and second source/drain regions, and wherein the gate electrode is disposed at three sides of the ridge.

4. The integrated circuit according to claim 2, wherein each channel region includes a fin-region in which the channel region has the shape of a ridge, the ridge includes a top side and two lateral sides in a cross section perpendicular to a line connecting the first and second source/drain regions, and wherein the gate electrode is disposed at three sides of the ridge.

5. The integrated circuit according to claim 1, wherein two word lines are disposed in each of the isolation grooves, the two word lines being isolated from each other and being assigned to two different rows of active areas.

6. The integrated circuit according to claim 1, further comprising a storage capacitor connected with a first source/drain region, wherein the storage capacitor is a stacked capacitor.

7. The integrated circuit according to claim 1, further comprising a plurality of memory cells, each memory cell comprising a storage capacitor, wherein an active area, a gate electrode, and the memory cells are arranged in rows and columns, respectively, and the memory cells are further arranged in the form of a regular grid.

8. The integrated circuit according to claim 1, wherein each gate electrode has a bottom side, each of the first and second source/drain regions extending to a depth below or equal to the bottom side of the gate electrode.

9. The integrated circuit according to claim 3, wherein each of the first and second source/drain regions extend to a depth below or equal to the top side of the ridge.

10. The integrated circuit according to claim 4, wherein each of the first and second source/drain regions extend to a depth below or equal to the top side of the ridge.

11. The integrated circuit according to claim 1, further comprising:
bit lines extending along a second direction intersecting the first direction, each of the second source/drain regions being connected with one bit line, wherein the bit lines are formed on the substrate surface to be in contact with a plurality of second source/drain regions.

12. The integrated circuit according to claim 1, wherein an isolating spacer is disposed between each first source/drain region and corresponding gate electrode and between each second source/drain region and corresponding gate electrode, the isolating spacer having a larger thickness than the gate isolating layer for each gate electrode.

13. The integrated circuit according to claim 12, wherein each isolating spacer is made of silicon dioxide.

14. The integrated circuit according to claim 1, wherein each of the active areas of one row of active areas are isolated from each other by isolation trenches filled with an isolating material.

15. The integrated circuit according to claim 6, wherein the storage capacitor comprises a storage electrode and a counter electrode, and the storage and counter electrodes are disposed above the substrate surface.

16. The integrated circuit according to claim 11, wherein the bitlines are in direct contact with the second source/drain regions such that no bitline contact is disposed between the bitlines and the second source/drain regions.

17. The integrated circuit according to claim 11, further comprising a storage capacitor is disposed above the bitlines.

18. An integrated circuit including a memory cell array, the memory cell array comprising:
a plurality of memory cells, each of the memory cells including a transistor with a first source/drain region and a second source/drain region, wherein the first and second source/drain regions are distanced from and oriented with respect to each other along a first direction; and
a plurality of word lines, wherein each of the word lines includes a length that extends in the first direction, and wherein each transistor comprises a gate electrode configured to connect with two adjacent word lines.

19. The integrated circuit according to claim 18, further comprising:
active areas arranged in rows, wherein the transistors are formed in the active areas; and
a plurality of isolation grooves, each isolation groove comprising two word lines;
wherein adjacent rows of active areas are separated from each other by the isolation grooves.

20. The integrated circuit according to claim 18, further comprising bitlines extending along a second direction intersecting the first direction.

21. The integrated circuit according to claim 20, wherein the bitlines are in contact with a substrate surface such that no bitline contact is disposed between the bitlines and a source/drain region of a corresponding transistor.

22. The integrated circuit according to claim 21, wherein a storage capacitor is disposed above the bitlines.

23. The integrated circuit according to claim 18, further comprising:
a plurality of bitlines; and
a plurality of storage capacitors disposed above the bitlines.

* * * * *